US006723209B2

(12) United States Patent
Baldwin et al.

(10) Patent No.: US 6,723,209 B2
(45) Date of Patent: *Apr. 20, 2004

(54) SYSTEM AND METHOD FOR PERFORMING THIN FILM DEPOSITION OR CHEMICAL TREATMENT USING AN ENERGETIC FLUX OF NEUTRAL REACTIVE MOLECULAR FRAGMENTS, ATOMS OR RADICALS

(75) Inventors: David Alan Baldwin, Annadale, VA (US); Todd Lanier Hylton, Vienna, VA (US)

(73) Assignee: 4-Wave, Inc., Sterling, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/200,578

(22) Filed: Jul. 22, 2002

(65) Prior Publication Data

US 2003/0024807 A1 Feb. 6, 2003

Related U.S. Application Data

(63) Continuation-in-part of application No. 10/137,897, filed on May 2, 2002, which is a continuation-in-part of application No. 09/810,687, filed on Mar. 16, 2001, now Pat. No. 6,402,904, and a continuation-in-part of application No. 09/810,688, filed on Mar. 16, 2001, now Pat. No. 6,402,900.

(51) Int. Cl.$^7$ ............................................... C23C 14/34
(52) U.S. Cl. ......................... 204/192.12; 204/298.06; 204/298.08; 204/298.23; 204/298.28

(58) Field of Search .................. 204/192.11, 192.12, 204/298.04, 298.06, 298.23, 298.28, 298.08

(56) References Cited

U.S. PATENT DOCUMENTS 6,402,904 B1 * 6/2002 Baldwin et al. ........ 204/192.13
6,413,380 B1 * 7/2002 Pinarbasi ............... 204/192.11

OTHER PUBLICATIONS

Zhurin et al., "Biased target deposition", J. Vac. Sci. Technol. A 18(1), Jan./Feb. 2000, pp. 37–41.*

* cited by examiner

Primary Examiner—Steven VerSteeg
(74) Attorney, Agent, or Firm—Morgan, Lewis & Bockius LLP

(57) ABSTRACT

A system and method for forming a chemically reacted layer proximate an exposed surface of a substrate is disclosed. A gas supply provides a chemically reactive molecular gas to an ion source that generates a divergent ion current directed at a target. The ion current contains at least one species of chemically reactive molecular ion, and the target is disposed in a chamber having a partial vacuum. A voltage source applies a bias to the target such that chemically reactive molecular ions from the ion source are accelerated toward the target with sufficient kinetic energy to dissociate at least some of the chemically reactive molecular ions by collision with the surface of the target.

32 Claims, 5 Drawing Sheets

SYSTEM AND METHOD FOR PERFORMING THIN FILM DEPOSITION OR CHEMICAL TREATMENT USING AN ENERGETIC FLUX OF NEUTRAL REACTIVE MOLECULAR FRAGMENTS, ATOMS OR RADICALS

CROSS-REFERENCE TO RELATED APPLICATIONS

The present application is a continuation-in-part of U.S. Pat. appl. Ser. No. 10/137,897, filed May 2, 2002, entitled "System and Method for Performing Sputter Deposition With Multiple Targets Using Independent Ion and Electron Sources and Target Biasing with DC Pulse Signals" (incorporated herein by reference), which is a continuation-in-part of appl. Ser. No. 09/810,687 now U.S. Pat. No. 6,402,904, filed Mar. 16, 2001, entitled "System and Method for Performing Sputter Deposition Using Independent Ion and Electron Current Sources and a Target Biased with an A-Symmetric Bi-Polar DC Pulse Signal" (incorporated herein by reference) and a continuation-in-part of appl. Ser. No. 09/810,688 now U.S. Pat. No. 6,402,900 filed Mar. 16, 2001, entitled "System and Method for Performing Sputter Deposition Using Ion Sources, Targets and Substrate Arranged About the Faces of a Cube."

FIELD OF INVENTION

The present invention is directed generally to novel systems and methods for performing thin film deposition or chemical treatment of substrates, and to optical devices manufactured using such systems and methods.

BACKGROUND OF THE INVENTION

U.S. Pat. No. 6,402,904 (the '904 patent) and U.S. patent application Ser. No. 09/810,688 filed Mar. 16, 2001, entitled "System and Method for Performing Sputter Deposition Using Ion Sources, Targets and a Substrate Arranged About the Faces of a Cube" (also incorporated herein by reference) (the '688 application) disclose systems and methods for ion sputter deposition of thin films on a substrate which involve directing ions from at least one plasma ion source generally towards at least one sputter target, each target having its own associated ion source. In operation, negative voltages applied to the target(s) attract ions from the plasma and accelerate the ions toward the target to sufficient kinetic energies (50 to 5000 eV) to cause sputtering of the target. Electron sources may also be provided. For reasons of avoiding charge build-up on insulating targets, the negative voltages may be pulsed or even alternately pulsed with positive pulses which serve to attract electrons to the target to neutralize it.

The '904 patent discloses yet another ion source directed generally at the substrate, and its main purpose is to bombard the growing film on the substrate with ion species chemically reactive with the sputter-deposited atoms from the target(s) to form compound thin films. For example $O_2^+$, $N_2^+$, $H_2^+$ and other ions collide with the growing film surface, dissociate and chemically react with the depositing atom flux sputtered from targets composed of pure Si, Al, Ti, Ta and others. In their respective combinations, compound thin films such as $SiO_2$, $Si_3N_4$, $Si_xH_{1-x}$, $Al_2O_3$, $AlN$, $TiO_2$, $TiN$, $Ta_2O_5$, $TaN$ and many others may be formed on the substrate. In the prior art, such an added ion source directed at the substrate enables so-called ion-assisted deposition (IAD).

IAD has many benefits. IAD supplies highly reactive O, N, H and other atomic species via surface-collisional dissociation of molecular ions, while the parent molecular species would not necessarily react (e.g., $N_2$). This makes it easy to attain complete stoichiometry of various oxides, nitrides, hydrides and other compounds. IAD may also affect film growth by momentum-transfer physics, even with inert gas ions. IAD adds several controllable parameters to the process of thin film deposition. These are IAD ion species (and mixtures thereof), ion mass, ion kinetic energy, ion current density and ion incidence angle. Singly and in combination, variations in these parameters generally have a strong effect on film density, degree of crystalline versus amorphous character of the film, intrinsic film stress, refractive index, crystalline texture (grain orientation), crystalline grain size, grain boundary morphology, surface flatness/roughness and others. In addition, IAD may have the effect of pre-cleaning the substrate surface, removing "native oxides", removing loosely-bound atoms, intermixing the substrate and film atoms and other effects, which collectively may improve film adhesion, environmental degradation rate, nucleation/seeding of desired thin film morphologies and other properties.

It would be desirable to retain as many benefits of IAD as possible while eliminating certain drawbacks. Many practitioners of thin film deposition art consider IAD too violent and damaging when applied to highly sensitive, damage-prone substrates. Damage-prone substrates include semiconductor laser diode emission facets, metal layers adjacent to electron tunnel-barrier in magnetic tunnel junctions, electron tunnel-barrier layers themselves, advanced transistor conduction channels when a gate dielectric is to be deposited on them, advanced transistor gate dielectrics themselves and advanced transistor gate metal contacts. Generally, the critical zones of these devices are on the order of 0.5 to 5 nm (5 to 50 Å) in depth and at the deposition surface.

With respect to these devices, practitioners typically fear two aspects of IAD. These are momentum transfer effects and electric charge effects. Regarding momentum transfer damage to sensitive substrates, practitioners would prefer surface collision energies to be below ~5 eV, to avoid disruption of the substrate lattice, intermixing and/or sputtering. Yet the dissociation energies of the reactive IAD ions, $O_2^+$, $N_2^+$, $H_2^+$, etc. lies between 5 and 10 eV, and the kinetic energy of the incident ions must be at least approximately equal to these values or there is not enough energy to dissociate the chemical bond. At these low energies, the dissociation fraction of these species is <10%, and, in practice, to achieve reasonably high dissociation efficiencies, the collision energy must be 5 to 10 times higher. In this higher (25 eV to 100 eV per ion) kinetic energy range, it is justifiably expected that significant momentum-transfer damage may occur, either by lattice disruption, intermixing or sputtering.

Regarding electric charge damage to sensitive substrates, the arriving ions may build up a macroscopic positive charge on the surface of an insulating substrate, which can lead to dielectric breakdown with attendant local heating or lattice disruption. In addition, these typical IAD ions, including non-reactive $Ar^+$ assist ions, induce a phenomenon called Auger neutralization microscopically at the surface at the location each ion collides with the surface. In Auger processes, the ion abstracts an electron from the atoms at the surface with the result that an amount of energy equal to the ionization potential of the ion (or the molecule which was ionized to form the ion) minus the binding energy of the electron abstracted from the surface atom must be dissipated. Most of this energy is dissipated to the surface atoms, potentially causing lattice disruption and/or local heating.

Both types of electric charge damage are avoided if ions are simply not used.

A number of authors report the fact that reactive neutral atoms, radicals and molecular fragments may be produced in the gas phase (within a plasma) by various processes (electron impact excitation being the main one), and that these atoms, radicals and molecular fragments may find their way to the surface of the growing film and participate in film growth. Reactive neutrals in the plasma are either formed at low translational kinetic energy or become thermalized to low translational kinetic energy due to collisions with the background gas. Because of these same processes, all directionality of the reactive neutrals towards the substrate and the growing film is likewise absent or lost. Therefore the concept of using these reactive neutrals produced in the gas phase in place of IAD ions fails. H. F. Winters ["Elementary processes at solid surfaces immersed in low pressure plasmas," In: Topics in Current Chemistry, Vol. 94, p. 69, M. J. S. Dewar, et al (eds.), Berlin, Springer-Verlag, 1980] states in Sect. 2.2.6.2 (p. 106 ff) that, when a molecular ion collides with a solid surface, it is usually dissociated into its various constituent atoms and that some of these atoms (or radicals) are reflected away from the target. He further speculates that these reflected atoms may be incorporated into growing films. P. Martin et al ["Optical properties and stress of ion-assisted aluminum nitride thin films", Applied Optics 31(31) p.6734 (1992)], plus others they cite, speculate that energetic back-reflected neutrals, including N atoms, from a sputtering target may contribute to some anomalous film stress results they obtained. The research group of K. W. Hipps [e.g., L. Huang, X.-D. Wang, K. W. Hipps, U. Mazur, R. Heffron and J. T. Dickinson, "Chemical etching of ion beam deposited AlN and AlN:H," Thin Solid Films 279 p.43 (1996)] deposited aluminum nitride and silicon nitride in numerous studies using single-ion-beam sputter deposition. Since room temperature thermal $N_2$ gas does not react with either aluminum or silicon to form a nitride, it can be inferred that the main source of reactive nitrogen in their deposition apparatus was back-scattered N atoms from the target (N could also be implanted into the target and re-sputtered into the film).

It is believed that a flux of neutral reactive atoms (or radicals or molecular fragments) directed to the surface of a depositing thin film with kinetic energy of approximately 1 eV to approximately 30 eV would confer almost all the benefits of IAD and avoid most of the drawbacks of IAD. Providing a practical, efficient, cost-effective system and method for obtaining this is an object of the present invention. It is further believed to be beneficial that the flux of neutral reactive atoms traverse the distance from the atom source to the surface being treated with substantially no gas phase collisions, thus preserving the directionality and kinetic energy distribution of the atoms arriving at the surface. Obtaining this is a further object of the present invention. Finally, it is believed to be desirable that the intensity of the neutral atom flux be commensurate with industrial thin film deposition rates of approximately 0.1 to 1 nm/sec and that this flux be substantially uniform over the surface of substrates of 200 mm to 300 mm diameter. Obtaining this is a further object of the present invention.

A variety of sources for energetic, directional, reactive atoms (or radicals) appear in prior art, but none of these meet all of the objects of the present invention. M. Ross et al [M. M. Ross, R. J. Colton, S. L. Rose, J. R. Wyatt, J. J. DeCorpo and J. E. Campana, "On the development and use of fast atom beams for the SIMS analysis of polymers and insulators," J. Vac. Sci. Technol. A 2(2), p.748 (1984).] formed an energetic neutral beam by (partially) neutralizing an accelerated ion beam on a metal surface. The method of Ross et al, and others they cite, are typical of a number of techniques suitable for analytical instrumentation or fundamental research purposes, in that the atom flux is quite low and the spot size small.

Another method involving post-neutralization of an ion beam is disclosed by Albridge et al [U.S. Pat. No. 4,775,789 Oct. 4, 1988]. Here the ion beam is mass-selected with a Wien filter to isolate $O^+$ ions from $O_2^+$ ions, as desired, then the ions are decelerated with an electrostatic lens, to the desired kinetic energy before neutralization occurs at a controlled grazing angle at a metal plate. This apparatus produced a 5 eV O atom flux of $2\times10^{15}$ atoms $cm^{-2}$ $s^{-1}$, which simulates O atom fluxes encountered by spacecraft in Earth orbit, and was intended for material erosion studies in such environments. The atom beam spot size was ~1 mm, and scaling up appears difficult and expensive.

Kuwano [H. Kuwano, "Fast atom beam techniques for BN and other hard film formations and applications to friction-reducing coatings," Materials Science Forum Vols. 54 & 55 p. 399 (1990).] used a McIlraith (saddle field type) cold cathode ion source followed by a gaseous charge-exchange cell to produce ~1 KeV inert gas atom beams via resonant charge exchange of the inert gas ions in an atmosphere of the same inert gas. Kuwano used two such fast atom sources, one to sputter a target and the other to take the place of an ion assist source to bombard the surface of the growing film. Such a method provides inefficient means of dissociating molecular ions into atoms, and, in the case of using a pre-selected atomic ion beam such as $N^+$ or $O^+$, resonant charge exchange neutralization would be difficult owing to the impracticality of producing sufficient density of neutral N or O atoms in the charge-exchange cell while keeping the overall pressure low enough to allow passage of the fast ions/atoms out the exit of the cell.

Schultz et al [M. Lu, A. Bousetta, R. Sukach, A. Bensaoula, K. Eipers-Smith, K. Waters and J. A. Schultz, "The growth of cubic boron nitride on Si(100) by neutralized nitrogen ion bombardment," Appl. Phys. Lett. 64(12) p. 1514 (1994).] have constructed a very efficient and functional reactive atom source by taking the accelerated output beam of a Kaufman ion source (dual-gridded electron-impact ionization type source), ionizing, e.g., $N_2$ gas, and directing it through a series of open-ended cones, in which both neutralization and dissociative forward scattering occurs, leading to a gently convergent neutral atom beam of controllable kinetic energy. If a divergent beam is required, the cone angles can be changed and the substrate positioned farther away, beyond the cross-over waist of the convergent beam. Ionwerks, Inc. (http://www.ionwerks.com/nabs.htm) sells a version of this neutral atom beam source (NABS) commercially. The NABS requires large Kaufman sources that are expensive, the grids wear and become electrically shorted by sputter debris and the ion current output decreases sharply as a function of ion beam energy below 250 eV due to space charge limitations within the grids.

Kleiman et al [J. I. Kleiman, Z. A. Iskanderova, Y. I. Gudimenko and R. C. Tennyson, "Potential applications of hyperthermal atomic oxygen for treatment of materials and structures," Surface and Interface Analysis 23 (1995).] describe another apparatus intended to simulate ~5 eV atomic oxygen encountered in Earth orbit. This apparatus produces a beam of helium, atomic oxygen and molecular oxygen via a microwave-induced plasma in a helium-oxygen gas mixture followed by supersonic expansion. It can produce a higher O atom flux than the Albridge apparatus but is limited to the kinetic energy range practically achievable by supersonic expansion, <~4 eV, for O atoms. One object of the present invention is to reach at least 30 eV.

Another apparatus employing supersonic expansion is disclosed by Hinchliffe [U.S. Pat. No. 5,821,548 Oct. 13, 1998]. In this apparatus, a corona discharge of 10,000 to 30,000 volts DC is maintained in a gas between the expansion nozzle and a second electrode, while a downstream skimmer serves to isolate a portion of the expanding plasma and allow it to reach a substrate to be treated. In this system, the plasma (ions and electrons) reaches the substrate, the kinetic energy ranges of the atomic/molecular/ionic particles reaching the substrate is not specified, and the means of control thereof is not defined.

Another device intended to supply hyperthermal O atoms to simulate Earth orbit environment is disclosed by Outlaw et al [U.S. Pat. No. 5,834,768 Nov. 10, 1998 and self-cited prior art U.S. Pat. No. 4,828,817 May 9, 1989]. In this device oxygen molecules are supplied to one side of a hot metal membrane and dissociated O atoms therefrom diffuse through the metal and appear as O atoms adsorbed on the other side of the membrane. From there, a portion of the O atoms are energetically desorbed by electron-stimulated desorption (ESD) or photon-stimulated desorption (PSD) and are used to treat a substrate. However, both ESD and PSD, and the kinetic energy with which the O atom is ejected, are controlled by atomic and solid-state electronic structure and energetic effects. As such, the kinetic energy of the ejected O atoms is not continuously variable and is specific to the chemical identity of each O-metal couple. Moreover, the kinetic energies of ejection are low, i.e., a few eV at most. Also, in a high-rate, mass-production deposition apparatus, the substrate side of the metal membrane might become coated with stray coating intended for the substrate, thus potentially "poisoning" the inner surface of the membrane for either surface accumulation of O atoms or their desorption, rendering the device impractical in this application.

SUMMARY OF THE INVENTION

The present invention is directed to a system and method for forming a chemically reacted layer proximate an exposed surface of a substrate. A gas supply provides a chemically reactive molecular gas to an ion source that generates a divergent ion current directed at a target. The ion current contains at least one species of chemically reactive molecular ion, and the target is disposed in a chamber having a partial vacuum in the range of $10^{-2}$ to $10^{-5}$ Torr. A voltage source applies a bias to the target such that chemically reactive molecular ions from the ion source are accelerated toward the target with sufficient kinetic energy to dissociate at least some of the chemically reactive molecular ions by collision with the surface of the target to form a population of neutral chemically reactive molecular fragments, atoms or radicals at least some of which scatter away from the surface of the target and into the chamber. At least a portion of the population of neutral chemically reactive molecular fragments, atoms or radicals is intercepted at an exposed surface of a substrate disposed in the chamber. The neutral chemically reactive molecular fragments, atoms or radicals intercepted by the substrate have a kinetic energy that is a function of a value of the bias. The chemically reacted layer corresponds to a product of at least one chemical reaction of the neutral chemically reactive molecular fragments, atoms or radicals intercepted by the substrate with other atoms proximate the exposed surface of the substrate. In one embodiment, the chemically reacted layer is formed without bombarding the exposed surface of the substrate with ions.

In accordance with further aspects, a controller may vary the value of the bias applied to the at least one target, and thereby vary the kinetic energy of the neutral chemically reactive molecular fragments, atoms or radicals intercepted by the substrate. In one embodiment, the controller continuously varies the value of the bias applied to the at least one target, and thereby continuously varies the kinetic energy of the neutral chemically reactive molecular fragments, atoms or radicals intercepted by the substrate over a range from 1–30 eV or higher. The controller can also optionally vary an angle of the substrate such that an arrival angle of the neutral chemically reactive molecular fragments, atoms or radicals intercepted at the exposed surface of the substrate varies from a substantially normal angle of incidence to a substantially grazing angle of incidence. An electron source may also be disposed in the chamber to provide electrons that neutralize accumulated ion-charge build-up on the target.

In accordance with a further aspect, the chemically reactive molecular ions accelerated toward the target cause atoms from the surface of the target to be sputtered away from the target, and a portion of the atoms sputtered from the surface of the target collect upon the exposed surface of the substrate with the neutral chemically reactive molecular fragments, atoms or radicals intercepted by the substrate. A thin film formed on the exposed surface of the substrate includes a chemical compound or alloy resulting from reaction of the atoms sputtered from the surface of the target with the neutral chemically reactive molecular fragments, atoms or radicals intercepted by the substrate.

In a further embodiment, first and second targets are disposed in the chamber. In this embodiment, chemically reactive molecular ions accelerated toward the first target cause atoms from the surface of the first target to be sputtered away from the first target, and chemically reactive molecular ions accelerated toward the second target cause atoms from the surface of the second target to be sputtered away from the second target. Portions of the atoms sputtered from the surfaces of the first and second targets collect upon the exposed surface of the substrate with neutral chemically reactive molecular fragments, atoms or radicals scattered from the first and second targets and intercepted by the substrate. A thin film formed on the exposed surface of the substrate includes a chemical compound or alloy resulting from reaction of the atoms sputtered from the surfaces of the first and second targets with the neutral chemically reactive molecular fragments, atoms or radicals scattered from the first and second targets and intercepted by the substrate. A controller may vary or control properties of the thin film by controlling arrival rates at the exposed surface of the substrate of the atoms sputtered from the surfaces of the first and second targets and the neutral chemically reactive molecular fragments, atoms or radicals scattered from the first and second targets.

In the two target embodiment, a first ion source may be used to generate a first divergent ion current directed predominately at the first target and a second ion source may be used to generate a second divergent ion current directed predominately at the second target. The first divergent ion current optionally includes a first species of ions that is different from a second species of ions in the second divergent ion current. For example, the first species may comprise inert gas ions while the second species comprises reactive molecular gas ions. Alternatively, the first and second species may respectively comprise first and second species of reactive molecular gas ions.

In the two target embodiment, the controller may independently control a quantity of the first species of ions directed at the first target and a quantity of the second species of ions directed at the second target. Similarly, the controller may independently control a first magnitude of flux of neutral chemically reactive molecular fragments, atoms or radicals scattered from the first target and a second magnitude of flux of neutral chemically reactive molecular fragments, atoms or radicals scattered from the second target. In some cases, a chemical composition of the thin film depends at least in part on a ratio of the first magnitude to the second magnitude. In these cases, the controller may vary the ratio over time such that the chemical composition of the thin film formed on the substrate varies within a thickness of the thin film. For example, the chemical composition of the thin film formed on the substrate can be made to vary linearly, in a sinusoidal or parabolic fashion, or as a step-function, within the thickness of the thin film.

In the two target embodiment, the first target may be biased with a different voltage amplitude than the second target, and the controller may independently vary the biases applied to the first and second targets. Also, the base material of the first target may be the same as or different from a base material of the second target, and an amount of material sputtered from the first target may be the same as or different from the amount of material sputtered from the second target.

In accordance with a further aspect applicable to single or multi-target embodiments, the bias applied to the target corresponds to a pulsed DC voltage signal (e.g., a bi-polar DC voltage pulse signal or an a-symmetric bi-polar DC voltage pulse signal), and the controller varies a flux of the neutral chemically reactive molecular fragments, atoms or radicals scattered from the surface of the target by varying a width, amplitude or frequency of negative pulses in the DC voltage pulse signal.

BRIEF DESCRIPTION OF THE DRAWINGS

Throughout the accompanying drawings, like numerals are used to identify like elements. The drawings illustrate presently preferred embodiments of the invention, and, together with the general description given above and the detailed description given below, serve to explain features of the invention. In the Drawings.

DETAILED DESCRIPTION OF THE REFERRED EMBODIMENTS

Figure 1:
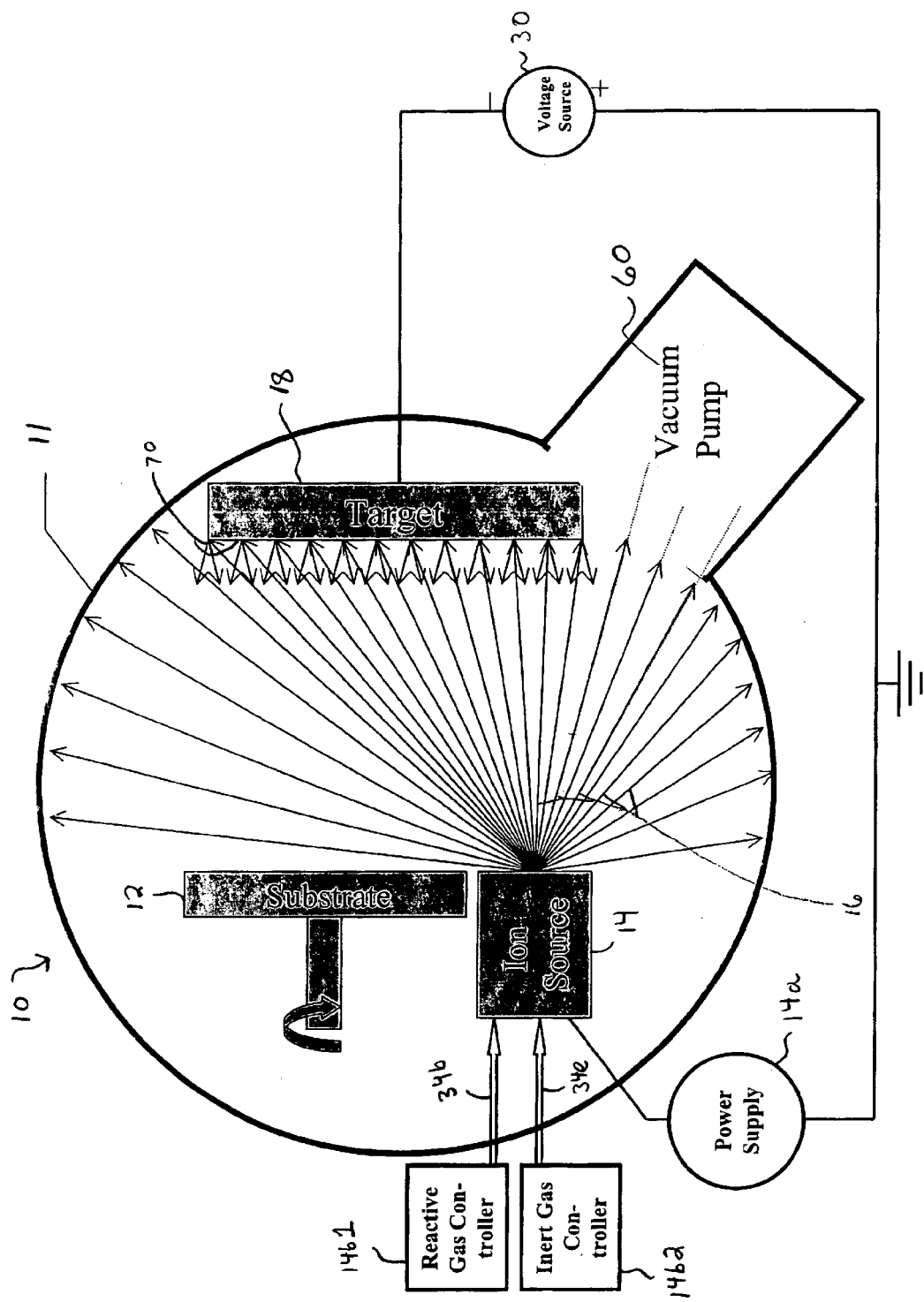
FIG. 1 is a diagram of a system for forming a chemically reacted layer near an exposed surface of a substrate using a directional, energetic flux of reactive molecular fragments, atoms or radicals, according to the present invention.
Figure 2:
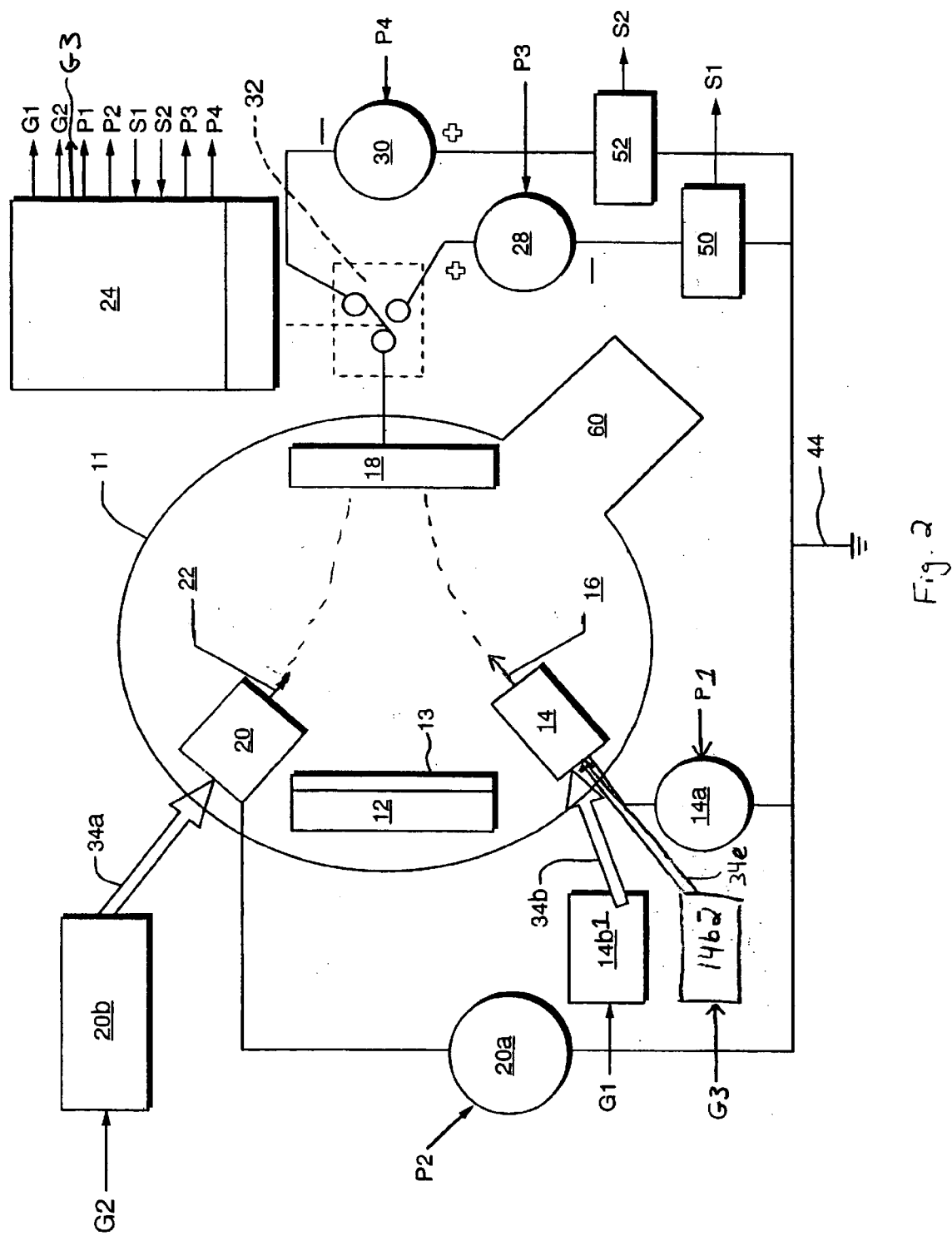
FIG. 2 is a more detailed diagram of a system for forming a chemically reacted layer near an exposed surface of a substrate using a directional, energetic flux of reactive molecular fragments, atoms or radicals, according to the present invention.

There is shown in FIGS. 1–2, a system 10 for forming a chemically reacted layer 13 on or near the surface of a substrate 12. Reactive gas controller 14b1 provides a chemically reactive molecular gas 34b to an ion source 14, which generates a divergent ion current 16 directed at the target 18. The ion current 16 contains at least one species of chemically reactive molecular ion, and the target 18 is disposed in a chamber 11 having a partial vacuum in the range of $10^{-2}$ to $10^{-5}$ Torr. A voltage source 30 applies a bias to the target 18 such that chemically reactive molecular ions from the ion source 14 are accelerated toward the target 18 with sufficient kinetic energy to dissociate at least some of the chemically reactive molecular ions by collision with the surface of the target 18 to form a population 70 of neutral chemically reactive molecular fragments, atoms or radicals at least some of which scatter away from the surface of the target 18 and into the chamber 11. At least a portion of the population 70 of neutral chemically reactive molecular fragments, atoms or radicals is intercepted at an exposed surface of the rotating substrate 12 disposed in the chamber 11. The neutral chemically reactive molecular fragments, atoms or radicals intercepted by the substrate 12 have a kinetic energy that is a function of a value of the bias. The chemically reacted layer 13 corresponds to a product of at least one chemical reaction of the neutral chemically reactive molecular fragments, atoms or radicals intercepted by the substrate 12 with other atoms proximate the exposed surface of the substrate 12. In one embodiment, the chemically reacted layer 13 is formed without bombarding the exposed surface of the substrate 12 with ions.

System 10 further comprises an electron source 20 that generates an electron current 22. The electron current 22 is directed at the target 18. The ion source 14, the electron source 20 and the target 18 are disposed in the chamber 11. A vacuum pump 60 reduces the pressure within the chamber 11. The pressure within the chamber 11 during operation is about $10^{-2}$ to $10^{-5}$ Torr.

Exemplary ion sources useful for implementing the present invention include end-Hall or closed drift Hall Ion sources such as the Mark II™ source of Commonwealth Scientific Corp. In one embodiment, each ion source is a divergent ion current source that generates a divergent ion beam characterized by an ion current distribution that varies in accordance with the equation: ion current=$J_o \cos(\theta)$; where $\theta$ is an angle between the central axis of the divergent ion beam and a direction of the ion current, and $J_o$ is the ion current density along the central axis. Exemplary electron sources useful for implementing the present invention include hollow cathode electron sources such Commonwealth Scientific Corp.'s HCES5000 or a plasma bridge electron source such as that offered by Commonwealth Scientific Corp. or Veeco Instruments. It will be appreciated by those familiar with the art that other types of plasma/ion sources could be used while still remaining within the scope of the present invention. In particular, when gases which are very corrosive to metals or which volatize metals are to be used (e.g., $F_2$, $Cl_2$, $NF_3$, HCl, HBr, $H_2S$, $PH_3$, ...), one may substitute a plasma source with only quartz, alumina or perfluoro polymers exposed to the plasma, materials thought to be much more resistant to corrosion or volatilization than most metals. Inductively-coupled radio frequency and antenna-coupled microwave plasma sources can be good examples of this design philosophy, both of which are commercially available.

A reactive gas 34b (for example, $AsH_3$, $BCl_3$, $Br_2$, CO, $CO_2$, $COCl_2$, $CCl_4$, $CF_4$, $Cl_2$, $CHClF_2$, $C_2ClF_5$, $CClF_3$, $C_2N_2$, $B_2H_6$, $CBr_2F_2$, $CCl_2F_2$, $CHCl_2F$, $(CH_3)_2SiCl_2$, $C_2Cl_2F_4$, $C_2H_2F_2$, $CH_4$, $C_2H_6$, $C_2H_4$, $C_2H_2$, $C_3H_8$, $C_3H_6$, $C_4H_{10}$, $C_4H_8$, $C_5H_{12}$, $CH_3F$, $CHF_3$, $CCl_3F$, $CCl_2F_2$, $CClF_3$, $CBrF_3$, $CHCl_2F$, $CHClF_2$, $CHF_3$, $C_2Cl_3F_3$, $C_2Cl_2F_4$, $C_2ClF_5$, $C_2F_6$, $C_2H_2F_2$, $C_4F_8$, $F_2$, $H_2$, HBr, HCl, HF, $MoF_6$, $N_2$, NO, $N_2O$, $NO_2$, $NF_3$, $NH_3$, $O_2$, $PH_3$, $SiH_4$, $SiCl_4$, $SiF_4$, $SiHCl_3$, $SiH_2Cl_2$, $Si(CH_3)_4$, $Si(OC_2H_5)_4$, $Si_2H_6$, $(SiH_3)_2O$, $SO_2$, $SH_2$, $SF_6$, $S_2F_2$, $WF_6$ or others) is supplied by a gas controller 14b1 (or mass flow controller) to ion source 14. An inert gas 34e (for example, He, Ne, Ar, Kr or Xe) is supplied by a gas controller 14b2 (or mass flow controller) to ion source 14. The volume of gas output by each gas controller 14b1, 14b2 is varied by process controller 24. An ion source power supply 14a is coupled to the ion source 14, and supplies a control voltage to ion source 14. The output of ion source power supply 14a is varied by process controller 24. Control signals (from process controller 24) are supplied to both the ion source power supply 14a, and the ion source gas controllers 14b1, 14b2, in order to vary the magnitude of ion current 16 at target 18. Inert ions are included in the ion current 16 in order to maintain a clean surface on target 18. In one embodiment, ion current 16 will vary linearly with changes in the flow rate of gases 34b, 34e supplied to ion source 14. In addition, for a given flow rate of gases 34b, 34e supplied to ion source 14, the ion current 16 generated from the ion source and flowing toward target 18 will vary proportionately with the magnitude of the voltage control signal supplied by ion source power supply 14a to ion source 14.

A gas 34a (for example, He, Ne, Ar, Kr, Xe or $N_2$) is supplied to electron source 20 by a gas controller (or mass flow controller) 20b. Gas 34a may be of a different type than gas 34b or 34e. The volume of gas output by gas controller 20b is varied by process controller 24. An electron source power supply 20a supplies a control voltage to electron source 20. The voltage supplied to electron source 20 by electron power supply 20a is varied by process controller 24. It will be understood by those skilled in the art that by varying the quantity of gas 34a supplied to electron source 20 and the voltage supplied by electron source power supply 20a to electron source 20, the electron current emanating from electron source 20 toward the sputtering target 18 may be controlled. In one embodiment, so long as a minimum quantity of gas 34a is supplied to electron source 20, the magnitude of the electron current 22 will vary linearly based on the magnitude of the signal supplied by the electron source power supply 20a to the electron source 20.

Referring still to FIGS. 1–2, system 10 further includes a pair of current sensors 50, 52. Each of the current sensors has an output that is coupled to process controller 24. Each current sensor preferably includes a low pass filter with a time constant that is relatively long when compared with the frequency of switch 32 (e.g., about 100 kHz) Each current sensor 50, 52, supplies a signal S1, S2, respectively, to process controller 24 that is proportional to the output of its corresponding voltage source 28, 30, averaged over time. Although in the embodiment shown, current sensors 50, 52 are shown as being disposed between voltage sources 28, 30, respectively, and ground, the current sensors 50, 52 could be positioned at any location in the circuitry useful for measuring the positive and negative currents at or near target 18.

Process controller 24 regulates the positive and negative currents at target 18 by varying independently the ion and electron currents 16, 22 with control signals P1, P2 to power supplies 14a, 20a, and control signals G1, G2, G3 to gas controllers 14b1, 14b2, 20b. Such control is independent of the settings applied to voltage sources 28, 30, which may be chosen/varied to optimize other properties such as deposition film qualities. In one embodiment, process controller 24 varies the ion current and electron current 16, 22, respectively, in order to deliver an equal amount of positive and negative charge to target 18 during each cycle of the a-symmetric bi-polar DC voltage pulse signal discussed below. Target neutralization is required, for example, to efficiently sputter material from the target when the target is insulating. In an alternative embodiment, process controller 24 varies the ion and electron currents 16, 22, respectively, so that about 10% more negative charge than positive charge is applied to target 18 during each cycle of the a-symmetric bi-polar DC voltage pulse signal. The purpose of this alternate embodiment is to assure neutralization of target 18. It will be understood by those skilled in the art that the relative percentages of positive and negative charge supplied to target 18 by the ion and electron currents 16, 22, respectively, during any given cycle of the a-symmetric bi-polar DC voltage pulse signal, are a matter of design choice, and that variations from the embodiments described herein are within the scope of the present invention.

Process controller 24 also includes a switch driver logic circuit that switches at about 100 KHz, but those skilled in the art will recognize that alternate types of pulse control systems may be used, including systems that operate at other frequencies. A switch signal (e.g. about 100 KHz) is supplied from process controller 24 to switch 32. Switch 32, together with biasing circuitry formed from a positive voltage source 28, and a negative voltage source 30, generate an a-symmetric bi-polar DC voltage pulse signal for biasing target 18. The control signals P3 and P4 adjust the magnitude of the positive and negative voltages (in the a-symmetric bi-polar DC pulse signal) applied to the target 18 by the voltage sources 28, 30.

Figure 5:
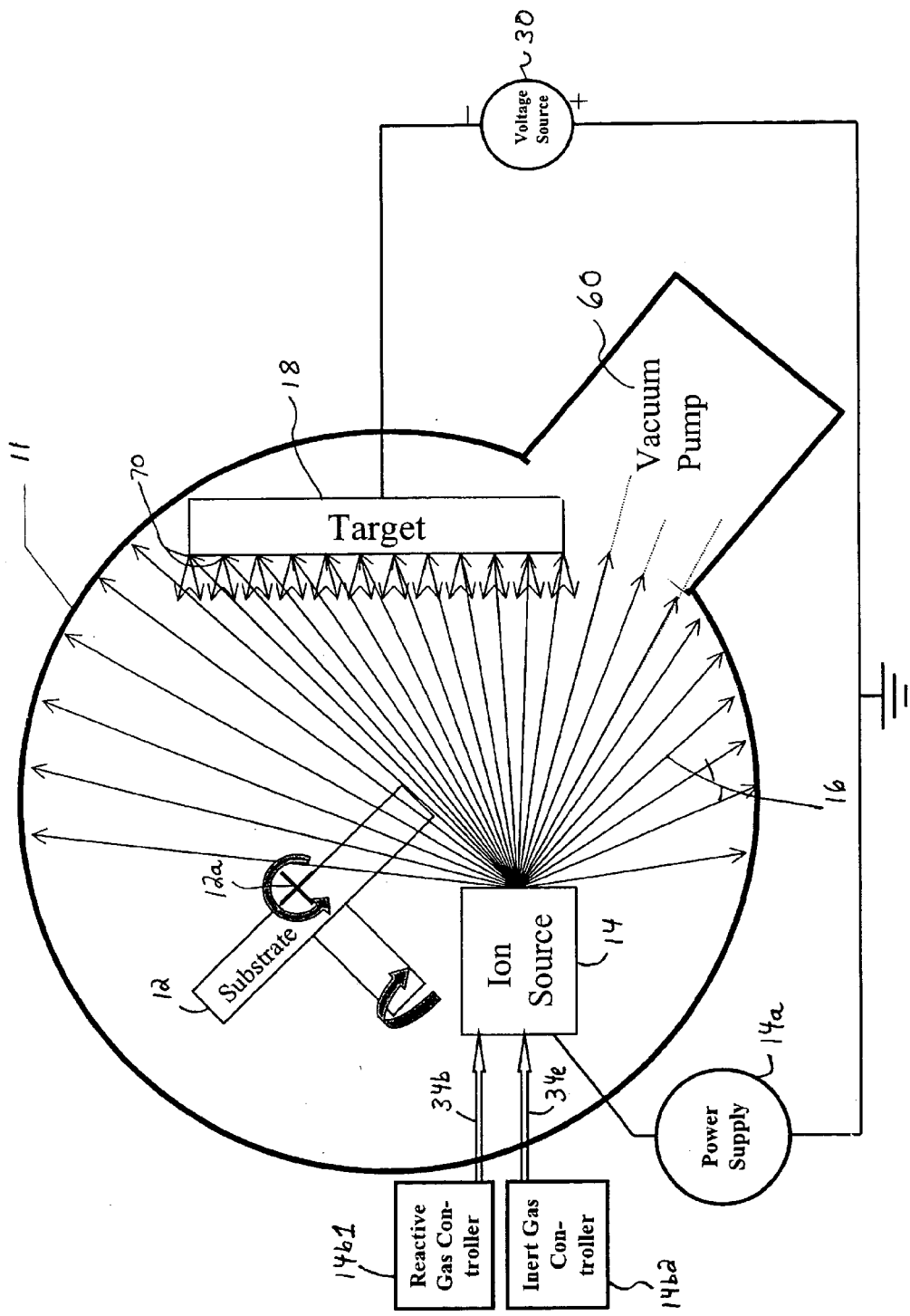
FIG. 5 is a diagram showing controlled tilting of the substrate, in accordance with one embodiment of the present invention.

Controller 24 can vary the value of the bias applied to the target 18, and thereby vary the kinetic energy of the neutral chemically reactive molecular fragments, atoms or radicals intercepted by the substrate 12. In one embodiment, the controller 24 is able to continuously vary this kinetic energy over a range of 1–30 eV (or higher). In addition, controller 24 can also optionally vary an angle of the substrate 12 about axis 12a (as shown in FIG. 5) such that an arrival angle of the neutral chemically reactive molecular fragments, atoms or radicals intercepted at the exposed surface of the substrate 12 varies from a substantially normal angle of incidence to a substantially grazing angle of incidence.

In some embodiments, the chemically reactive molecular ions accelerated toward the target 18 cause atoms (for example, Li, Be, B, C, Na, Mg, Al, Si, Sc, Ti, V, Cr, Mn, Fe, Co, Ni, Cu, Zn, Ga, Ge, As, Se, Y, Zr, Nb, Mo, Ru, Rh, Pd, Ag, Cd, In, Sn, Sb, Ta, W, Re, Os, Ir, Pt, Au, Pb, Bi, and others) from the surface of the target to be sputtered away from the target, and a portion of the atoms sputtered from the surface of the target 18 collect upon the exposed surface of the substrate 12 with the neutral chemically reactive molecular fragments, atoms or radicals 70 intercepted by the substrate 12. In this embodiment, a thin film 13 formed on the exposed surface of the substrate 12 includes a chemical compound or alloy resulting from reaction of the atoms sputtered from the surface of the target with the neutral chemically reactive molecular fragments, atoms or radicals 70 intercepted by the substrate.

An a-symmetric bi-polar DC pulse signal may be used to bias target 18. In this embodiment, the amount of negative charge supplied by electron current 22 to target 18 during the positive portion of each cycle of the a-symmetric bi-polar DC voltage pulse signal is roughly equal to the amount of positive charge supplied by ion current 16 to target 18 during the negative portion of each cycle of the a-symmetric bi-polar DC voltage pulse signal. This condition is generally necessary to neutralize the target on each cycle of the a-symmetric bi-polar DC voltage pulse signal.

Voltage source 30 supplies a negative voltage with respect to ground 44, and voltage source 28 supplies a positive voltage with respect to ground 44. In one embodiment, voltage source 28 supplies a DC voltage of about 50 V, voltage source 30 supplies a DC voltage of about −1000V, and switch 32 toggles between its two poles at about 100 kHz. It will be understood by those skilled in the art that the particular voltage levels supplied by sources 28, 30, and the particular frequency of switch 32 are matters of design choice, and the exemplary values given should not be considered as limitative of the scope of the present invention.

Use of the present invention allows for independent adjustment of ion and electron currents 16, 22 using relatively simple circuitry. In addition, by varying the voltages supplied by power supplies 28, 30 (using, for example, process controller 24) the upper and lower voltages in the a-symmetric bi-polar DC voltage pulse signal can be independently varied, thereby varying the voltages used to attract ions during the negative portion of the pulse cycle and electrons during the positive portion of the pulse cycle. In addition, it will be understood by those skilled in the art that, by varying the switching signal supplied to switch 32, the relative duration of the positive and negative portions of each cycle of the a-symmetric bi-polar DC voltage pulse signal can also be varied.

Figure 3:
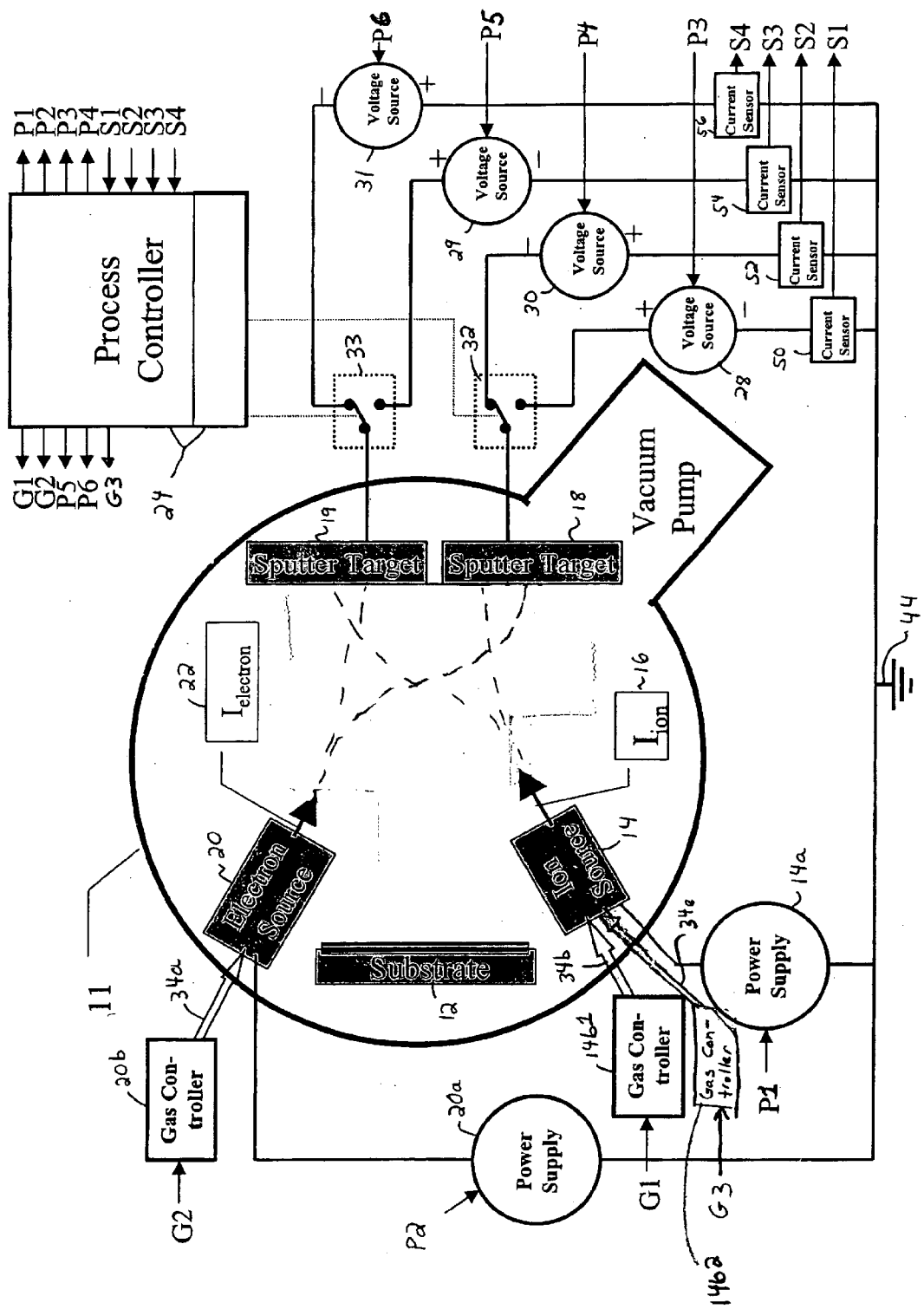
FIG. 3 is a diagram of a multi-target system for forming a chemically reacted layer near an exposed surface of a substrate, according to a further embodiment of the present invention.
Figure 4:
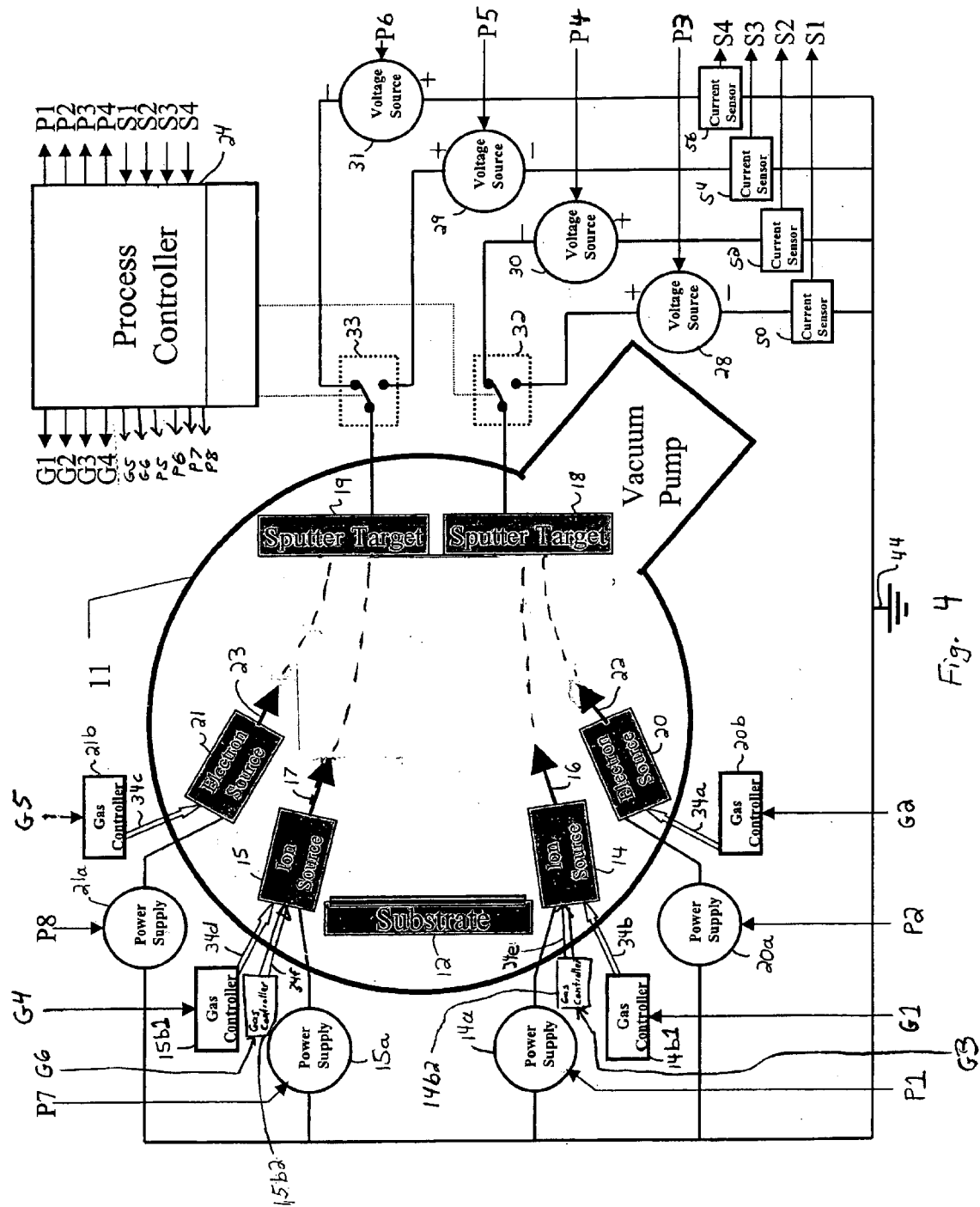
FIG. 4 is a diagram of a multi-target system for forming a chemically reacted layer near an exposed surface of a substrate, according to a still further embodiment of the present invention.

The system and method for independently controlling ion and electron currents described above in FIGS. 1 and 2 can also be applied in the context of a system where multiple targets 18, 19 are used to simultaneously apply materials from the targets onto a substrate. Two diagrams where multiple targets are used to simultaneously process or deposit material on a substrate are shown in FIGS. 3–4. Referring particularly to FIGS. 3–4, in these multi-target arrangements, the present invention achieves substantial process control by using a controller 24 that monitors currents (S1, S2, S3, S4) drawn by each target 18, 19. In response to this information, the controller 24 independently controls (i) the ion and electron currents applied to the targets, and (ii) the bi-polar DC voltage pulse used for biasing each target 18, 19, in order to achieve desired properties with respect to the processing of substrate 12, or the deposition of film 13 on the substrate 12. In the embodiment of FIG. 3, a single ion 14 source generates an ion current 16 that is applied to both targets 18, 19 and a single electron source 20 generates an electron current 22 that is applied to both targets 18, 19. In the FIG. 3 embodiment, the controller 24 independently varies the output of these singular ion and electron sources. By contrast, in the embodiment of FIG. 4, multiple ion sources 14, 15 and multiple electron sources 20, 21 are used to supply independent ion currents 16, 17 and independent electron currents 22, 23 to each of the targets 18, 19, respectively. In the FIG. 4 embodiment, a first ion source 14 generates a first ion current 16 directed at a first target 18 and a second ion source 15 generates a second (independent) ion current 17 directed at a second target 19, a first electron source 20 generates a first electron current 22 directed at the first target 18 and a second electron source 21 generates a second (independent) electron current 23 directed at the second target 19. In the FIG. 4 embodiment, the controller 24 varies the first ion current 16 independently from the first electron current 22, and the controller 24 varies the second ion current 17 independently from the second electron current 23. In a further embodiment (not shown), each target may receive ions from a different ion source, while both targets receive electrons from the same electron source.

Referring now to the embodiment of FIG. 4, in addition to the components described in connection with the previous figures, a gas $34d$ (for example, $AsH_3$, $BCl_3$, $Br_2$, $CO$, $CO_2$, $COCl_2$, $CCl_4$, $CF_4$, $Cl_2$, $CHClF_2$, $C_2ClF_5$, $CClF_3$, $C_2N_2$, $B_2H_6$, $CBr_2F_2$, $CCl_2F_2$, $CHCl_2F$, $(CH_3)_2SiCl_2$, $C_2Cl_2F_4$, $C_2H_2F_2$, $CH_4$, $C_2H_6$, $C_2H_4$, $C_2H_2$, $C_3H_8$, $C_3H_6$, $C_4H_{10}$, $C_4H_8$, $C_5H_{12}$, $CH_3F$, $CHF_3$, $CCl_3F$, $CCl_2F_2$, $CClF_3$, $CBrF_3$, $CHCl_2F$, $CHClF_2$, $CHF_3$, $C_2Cl_3F_3$, $C_2Cl_2F_4$, $C_2ClF_5$, $C_2F_6$, $C_2H_2F_2$, $C_4F_8$, $F_2$, $H_2$, $HBr$, $HCl$, $HF$, $MoF_6$, $N_2$, $NO$, $N_2O$, $NO_2$, $NF_3$, $NH_3$, $O_2$, $PH_3$, $SiH_4$, $SiCl_4$, $SiF_4$, $SiHCl_3$, $SiH_2Cl_2$, $Si(CH_3)_4$, $Si(OC_2H_5)_4$, $Si_2H_6$, $(SiH_3)_2O$, $SO_2$, $SH_2$, $SF_6$, $S_2F_2$, $WF_6$ or others) is supplied by a gas controller $15b1$ (or mass flow controller) to ion source 14. A gas $34f$ (for example, He, Ne, Ar, Kr or Xe) is supplied by a gas controller $15b2$ (or mass flow controller) to ion source 15. The volume of gas output by gas controllers $15b1$, $15b2$ is varied by process controller 24. An ion source power supply $15a$ is coupled to the ion source 15, and supplies a control voltage to ion source 15. The output of ion source power supply $15a$ is varied by process controller 24. Control signals (from process controller 24) are supplied to both the ion source power supply $15a$, and the ion source gas controllers $15b1$, $15b2$, in order to vary the magnitude of ion current 17 at target 19. Similarly, a gas $34c$ (for example, Ar, Xe or $N_2$) is supplied to electron source 21 by a gas controller (or mass flow controller) $21b$. Gas $34c$ may be of a different type than gas $34d$. The volume of gas output by gas controller $21b$ is varied by process controller 24. An electron source power supply $21a$ supplies a control voltage to electron source 21. The voltage supplied to electron source 21 by electron source power supply $21a$ is varied by process controller 24. It will be understood by those skilled in the art that by varying the quantity of gas $34c$ supplied to electron source 21 and the voltage supplied by electron source power supply $21a$ to electron source 21, the electron current emanating from electron source 21 toward the sputtering target 19 may be controlled.

The embodiments of FIGS. 3–4, include a further pair of current sensors 54, 56, each of which has an output that is coupled to process controller 24. Each current sensor 54, 56 preferably includes a low pass filter with a time constant that is relatively long when compared with the frequency of switch 33 (e.g., about 100 kHz.) Each current sensor 54, 56, supplies a signal S3, S4, respectively, to process controller 24 that is proportional to the output of its corresponding voltage source 29, 31, averaged over time. Although in the embodiment shown, current sensors 54, 56 are shown as being disposed between voltage sources 29, 31, respectively, and ground 44, the current sensors 54, 56 could be positioned at any location in the circuitry useful for measuring the positive and negative currents at or near target 19.

In the embodiments of FIGS. 3–4, process controller 24 regulates the positive and negative currents at target 19 by varying independently the ion and electron currents 16, 22 (in the case of FIG. 3) and 16, 17, 22, 23 (in the case of FIG. 4) with control signals P1, P2 (and P7, P8 in the case of FIG. 4) to power supplies $14a$, $20a$ (and $15a$, $21a$ in the case of FIG. 4), and control signals G1, G2, G3 to gas controllers $14b1$, $14b2$, $20b$ (and control signals G4, G5, G6 to gas controllers $15b1$, $15b2$, $21b$ in the case of FIG. 4.) Such control is independent of the settings (P3, P5, P4, P6) applied to voltage sources 28, 29, 30, 31 which may be chosen/varied to optimize other properties such as deposition film qualities.

In an application of the two target embodiments of FIGS. 3–4, chemically reactive molecular ions in ion current 16 are accelerated toward target 18 and cause atoms from the surface of target 18 to be sputtered away from target 18. Similarly, chemically reactive molecular ions (in ion current 16 in the FIG. 3 embodiment and in ion current 17 in the FIG. 4 embodiment) are accelerated toward target 19 and cause atoms from the surface of target 19 to be sputtered away from target 19. Portions of the atoms sputtered from the surfaces of the targets 18, 19 collect upon the exposed surface of the substrate 12 with neutral chemically reactive molecular fragments, atoms or radicals scattered from targets 18, 19 and intercepted by the substrate 12. A thin film 13 formed on the exposed surface of the substrate 12 includes a chemical compound or alloy resulting from reaction of the atoms sputtered from the surfaces of targets 18, 19 with neutral chemically reactive molecular fragments, atoms or radicals scattered from targets 18, 19 and intercepted by the substrate 12.

In a relatively simple example applicable to FIG. 3, gas 34a is $O_2$ and gas 34e is Ar. Gas controller 14b1 regulates the $O_2$ flow to about 50 sccm (standard cubic centimeters per minute) and gas controller 14b2 regulates the Ar flow to about 25 sccm. The combined $O_2$ and Ar gas flow, in these proportions, into ion source 14 produces an ion current 16 which is roughly 50% $O_2^+$ and 50% $Ar^+$, under desirable and achievable parameters of power supply 14a. Target 18 is made of bulk Si and target 19 is made of bulk Ti. When ion current 16 is accelerated onto target 18, predominantly Si atoms are sputtered off the target surface and predominantly O atoms are scattered away from the target surface, formed by collisional dissociation (and neutralization) of the $O_2^+$ ions incident upon the target. In like manner, when ion current 16 is instead accelerated onto target 19, predominantly Ti atoms are sputtered off the target surface and predominantly O atoms are scattered away from the target surface, formed by collisional dissociation (and neutralization) of the $O_2^+$ ions incident upon the target. Low energy neutral Ar atoms will also scatter away from whichever target is receiving the accelerated ion current 16, but such a flux has little effect on the deposited thin film 13 in the example process.

Controller 24 may vary or control properties of the thin film 13 by controlling arrival rates at the exposed surface of the substrate 12 of the atoms sputtered from the surfaces of targets 18, 19 and the neutral chemically reactive molecular fragments, atoms or radicals scattered from targets 18, 19. So, for example, three layers with differing properties (composition and refractive index) may be formed within thin film 13. The first layer is formed by programming controller 24 to apply a target voltage of −500 v to target 18 and 0 v to target 19. In this mode, a pure film of $SiO_2$ is deposited as thin film 13. It has a refractive index at 550 mn wavelength of $n_{550}$=1.48. A next layer is formed by programming controller 24 to apply a target voltage of −500 v to target 18 and −500 v to target 19. In this mode a mixed oxide film of $Si_xTi_{(1-x)}O_2$, where x is chosen from a range of 0 to 1, is deposited on top of the $SiO_2$ as the second layer of thin film 13. This mixed oxide has a refractive index of $n_{550}$=1.48 to 2.51, depending upon the value of x chosen. The third layer is formed by programming controller 24 to apply a target voltage of 0 v to target 18 and −500 v to target 19. In this mode, a pure film of $TiO_2$ is deposited on top of the previous two layers as the third layer of thin film 13. It has a refractive index of $n_{550}$=2.51. Extending this example to the configuration of FIG. 4, the controller 24 could alternatively or simultaneously control ion sources 14 and 15 by varying gas flow or power supply signals to the ion sources to vary ion currents 16 and 17 to target 18 and 19, respectively. This provides another way to control composition ratio x in mixed, compound or alloy thin films 13. Also, it would be apparent to those skilled in the art that the number of layers (3) in the example case could be increased to 4, 5 or any finite number, and still be within the scope of the present invention. Likewise, it would be apparent to those skilled in the art that the composition and properties of the layers in the example case could be varied by changing x to any particular value or to any finite number of particular values, and still be within the scope of the present invention.

In the two target embodiment shown in FIG. 4, ion source 14 is used to generate divergent ion current 16 directed predominately at target 18 and ion source 15 is used to generate divergent ion current 17 directed predominately at target 19. Divergent ion current 16 optionally includes a first species of ions that is different from a second species of ions in divergent ion current 17. For example, the first species may comprise inert gas ions while the second species comprises reactive molecular gas ions. Alternatively, the first and second species may respectively comprise first and second species of reactive molecular gas ions. Controller 24 may independently control a quantity of the first species of ions directed at target 18 and a quantity of the second species of ions directed at target 19, and thereby independently control a first magnitude of flux of neutral chemically reactive molecular fragments, atoms or radicals scattered from target 18 and a second magnitude of flux of neutral chemically reactive molecular fragments, atoms or radicals scattered from target 19. In some cases, a chemical composition of the thin film depends at least in part on a ratio of the first magnitude to the second magnitude. In these cases, controller 24 may vary the ratio over time such that the chemical composition of the thin film formed on the substrate 12 varies within a thickness of the thin film. For example, the chemical composition of the thin film formed on the substrate can be made to vary linearly, in a sinusoidal or parabolic fashion, or as a step-function, within the thickness of the thin film.

In the two target embodiments, target 18 may be biased with a different voltage amplitude than target 19, and controller 24 may independently vary the biases applied to targets 18, 19. Also, the base material of target 18 may be the same as or different from a base material of target 19 (e.g., Si for target 18 and Ti for target 19), and an amount of material sputtered from target 18 may be the same as or different from the amount of material sputtered from target 19.

In accordance with a further aspect applicable to single or multi-target embodiments, the bias applied to the target corresponds to a pulsed DC voltage signal (e.g., a bi-polar DC voltage pulse signal or an a-symmetric bi-polar DC voltage pulse signal), and controller 24 varies a flux of the neutral chemically reactive molecular fragments, atoms or radicals scattered from the surface of the target by varying a width of negative pulses in the DC voltage pulse signal.

In one application of the systems of FIGS. 3–4, at least two sputter targets, each associated with a single (common) ion source and a single (common) electron source (FIG. 3), or alternatively with its own independent ion source and independent electron source (FIG. 4), are disposed within a vacuum chamber, along with a deposition substrate 12 upon which it is desired to form a deposited alloy or compound film 13. An exemplary arrangement of these components is the "cube geometry", described in U.S. patent application Ser. No. 09/810,688, filed Mar. 16, 2001, entitled "System and Method for Performing Sputter Deposition Using Ion Sources, Targets and a Substrate Arranged About the Faces of a Cube." The systems shown in FIGS. 3–4 can be applied to various geometric arrangements of the targets within the apparatus, other than the cube geometry.

The drivers for switches 32, 33 can be programmed in various ways to achieve desired properties with respect to a deposited film. For example, an alloy or compound composition can be deposited on the substrate by establishing a ratio of pulse frequencies to the targets. Conditions can be readily established in which the amount of target material sputtered off of a given target is the same during each negative pulse applied to the target. Likewise, the amount of sputtered material arriving at the substrate and forming a deposited film is normally proportional to the amount of material sputtered off of a given target during each negative pulse. Hence, the composition of the alloy or compound deposited film can be controlled 'by relatively varying the number of negative pulses per unit time applied to each of the at least two targets. In operation, the target switch drivers are activated at frequencies ranging from 1 pulse per second to 100,000 pulses per second (100 KHz). Therefore, alloy and compound compositions can be directly varied over ratios of $1:10^5$ to $10^5:1$ of the at least two chemical components (e.g., chemical elements) making up the at least two targets and used to form the alloy or compound on the substrate. Those skilled in the art will recognize that the range of thin film composition ratios of $1:10^5$ to $10^5:1$ is not a fundamental limit, since it is possible to build target switches that operate up to at least 300 KHz (or pulse more slowly on the other target) and, additionally, one can vary the operational parameters for the ion source associated with each target so that the ion current drawn during each negative pulse of the targets varies from one target to the next, thereby varying the amount of material sputtered off the target per pulse. Likewise, the voltage levels of the targets' negative voltage sources can be varied to affect the amount of material sputtered off of each target per pulse. Also, the pulse width of the negative voltage pulses can be varied from one target to the next, and the amount of material sputtered off a target during each pulse will normally be directly proportional to the length of the pulse. It is readily feasible to obtain an additional three orders of magnitude of control by these four methods, giving thin film compositional control ratios of $1:10^8$ to $10^8:1$. Again, the range of ratios is not a fundamental limit and a larger range might be obtained and still be within the scope of the present invention.

A further exemplary method of the present invention varies the programming of the target switch drivers over time during the deposition process so as to as to deposit varying composition alloys and compounds within the same thin film on the substrate, as desired. For example, a gradient-composition alloy thin film can be made in which the composition ratio varies linearly with distance through the thickness of the thin film by appropriately varying the bi-polar pulses applied to each target during the deposition process. Such composition variations can be continuous to the sub-atomic-layer level. Since a crystal plane of a typical metal contains on the order of $10^{15}$ atoms per $cm^2$, and the present invention can vary composition over a range of $1:10^8$, compositions on a single atomic plane can be controlled to at least as low as $1\times10^8$ atoms-$cm^{-2}$ of one element versus $9.99999990\times10^{14}$ atoms-$cm^{-2}$ of the other element. The extensions to three targets and ternary alloys, four targets and quaternary allows, etc. obey the same sorts of ratio rules for composition. Likewise, it is clear that a gradient-composition alloy need not be deposited with linearly-varying composition ratio but may be fashioned to have a sinusoidal, parabolic, stepped or any other imaginable composition profile, within the ratio limits, by appropriate programming of the target switch drivers, the ion currents to the targets, the negative voltages to the targets, and the negative pulse widths.

Another embodiment of the invention shown in FIGS. 3–4 utilizes the readings from the target current sensors. Controller 24 can be programmed to respond to random or uncontrolled systemic variations in target current in either of two ways. First, controller 24 can increase or decrease the ion source output current for the ion source associated with that target, with the intention of quickly (milliseconds) restoring the target current to the desired level. Secondly, controller 24 can change the relative number of target pulses to each target to compensate for the variance in target current. In either case, the intention is to maintain the desired alloy composition in the deposited thin film 13.

Another type of target-pulse time-correlation control is valuable particularly when long (~0.01 to 1 second) negative pulses to the targets are used. In these cases it is desirable to have the negative pulses applied to the targets coinciding, in order to deposit alloy material rather than very thin multi-layers of alternating pure materials. However, if very thin layers of alternating pure materials are desired, then the negative pulses may be programmed to be anti-coincident. It would also be possible to vary the time-correlation of various pulses within the deposition period of a single thin film, in order to achieve specific desired results in the deposited thin film. Likewise, given the extreme of very long (>1 second) negative target pulses, it would be obvious to run the targets with DC (direct current) continuous voltages within the apparatus of the invention, to obtain sometimes-desirable results.

The present invention allows a much wider range of alloy composition (at least $1:10^8$ to $10^8:1$) to be deposited, with relative ease, compared with other known co-sputtering techniques. The wide-ranging independent control of negative voltages applied to the targets and, in the FIG. 4 embodiment, the wide-ranging, independent control of ion current to the targets allowed by the independent ion sources, are particularly advantageous over other co-sputtering techniques. The present invention can be applied to form optical filters such as rugate filters, with sinusoidal-varying composition, which create a narrow-band reflector. Another application is deposition of magnetic alloys such as permalloy ($Ni_xFe_{1-x}$) and CoPt, which are used in thin film disk heads. Another application is advanced transistor gate metals, which may be TiTa alloys, in which the ratio of alloy composition needs to be varied to match the work function to that of other parts of the transistor.

It will be appreciated by those skilled in the art that changes could be made to the embodiments described above without departing from the broad inventive concept thereof. It is understood, therefore, that this invention is not limited to the particular embodiments disclosed, but is intended to cover modifications within the spirit and scope of the present invention as defined in the appended claims.

What is claimed is:

1. A system for forming a chemically reacted layer proximate an exposed surface of at least one substrate, comprising:
    (a) at least one gas supply that provides a chemically reactive molecular gas to at least one ion source, wherein the at least one ion source generates at least one divergent ion current directed at at least one target, the ion current contains at least one species of chemically reactive molecular ion, and the at least one target is disposed in a chamber having a partial vacuum in the range of $10^{-2}$ to $10^{-5}$ Torr;

(b) a voltage source that applies a bias to the at least one target with respect to ground such that chemically reactive molecular ions from the at least one ion source are accelerated toward the at least one target with sufficient kinetic energy to dissociate at least some of the chemically reactive molecular ions by collision with a surface of the at least one target to form a population of neutral chemically reactive molecular fragments, atoms or radicals at least some of which scatter away from the surface of the at least one target and into the chamber; and (c) at least one substrate in the chamber, wherein at least a portion of said population of neutral chemically reactive molecular fragments, atoms or radicals is intercepted at an exposed surface of the at least one substrate, and wherein the neutral chemically reactive molecular fragments, atoms or radicals intercepted at the exposed surface of the at least one substrate have a kinetic energy that is a function of a value of the bias;

wherein the chemically reacted layer corresponds to a product of at least one chemical reaction of the neutral chemically reactive molecular fragments, atoms or radicals intercepted at the exposed surface of the at least one substrate with other atoms proximate the exposed surface of the at least one substrate;

wherein the chemically reacted layer is formed without bombarding the exposed surface of the at least one substrate with ions;

further comprising a controller that varies the value of the bias applied to the at least one target, and thereby varies the kinetic energy of the neutral chemically reactive molecular fragments, atoms or radicals intercepted at the exposed surface of the at least one substrate.

2. The system of claim 1, wherein the controller can continuously vary the kinetic energy over a range of values.

3. The system of claim 2, wherein an upper end of the range is equal to or greater than 30 eV.

4. The system of claim 1, further comprising a controller that varies an angle of the exposed surface of the at least one substrate such that an arrival angle of the neutral chemically reactive molecular fragments, atoms or radicals intercepted at the exposed surface of the at least one substrate varies.

5. The system of claim 4, wherein the controller varies the arrival angle of the neutral chemically reactive molecular fragments, atoms or radicals intercepted at the exposed surface of the at least one substrate from a substantially normal angle of incidence to a substantially grazing angle of incidence.

6. The system of claim 1, wherein the chemically reactive molecular ions accelerated toward the at least one target cause atoms from the surface of the at least one target to be sputtered away from the target.

7. The system of claim 1, wherein the at least one gas supply provides an inert gas to the at least one ion source, and a portion of the ion current generated by the at least one ion source includes ions of the inert gas.

8. The system of claim 1, further comprising an electron source disposed in the chamber, wherein the electron source provides electrons that neutralize accumulated ion-charge build-up on the at least one target.

9. The system of claim 1, wherein the bias applied to the at least one target corresponds to a pulsed DC voltage signal.

10. The system of claim 9, wherein the pulse DC voltage pulse signal is a bi-polar DC voltage pulse signal.

11. The system of claim 10, wherein the bi-polar DC voltage pulse signal is an a-symmetric bi-polar DC voltage pulse signal.

12. The system of claim 9, wherein the controller varies a flux of the neutral chemically reactive molecular fragments, atoms or radicals scattered from the surface of the at least one target by varying a width, amplitude or frequency of negative pulses in the DC voltage pulse signal.

13. The system of claim 1, wherein a chemically-reacted layer disposed proximate the surface of the at least one target comprises an electrical insulator.

14. A system for forming a chemically reacted layer proximate an exposed surface of at least one substrate, comprising:

(a) at least one gas supply that provides a chemically reactive molecular gas to at least one ion source, wherein the at least one ion source generates at least one divergent ion current directed at at least one target, the ion current contains at least one species of chemically reactive molecular ion, and the at least one target is disposed in a chamber having a partial vacuum in the range of $10^{-2}$ to $10^{-5}$ Torr;

(b) a voltage source that applies a bias to the at least one target with respect to ground such that chemically reactive molecular ions from the at least one ion source are accelerated toward the at least one target with sufficient kinetic energy to dissociate at least some of the chemically reactive molecular ions by collision with a surface of the at least one target to form a population of neutral chemically reactive molecular fragments, atoms or radicals at least some of which scatter away from the surface of the at least one target and into the chamber; and (c) at least one substrate in the chamber, wherein at least a portion of said population of neutral chemically reactive molecular fragments, atoms or radicals is intercepted at an exposed surface of the at least one substrate, and wherein the neutral chemically reactive molecular fragments, atoms or radicals intercepted at the exposed surface of the at least one substrate have a kinetic energy that is a function of a value of the bias;

wherein the chemically reacted layer corresponds to a product of at least one chemical reaction of the neutral chemically reactive molecular fragments, atoms or radicals intercepted at the exposed surface of the at least one substrate with other atoms proximate the exposed surface of the at least one substrate;

wherein the chemically reactive molecular ions accelerated toward the at least one target cause atoms from the surface of the at least one target to be sputtered away from the target;

wherein the at least one target comprises first and second targets, and the first target is biased with a different voltage amplitude than the second target.

15. The system of claim 14, further comprising a controller that independently varies the biases applied to the first and second targets.

16. The system of claim 14, wherein a base material of the first target is the same as a base material of the second target.

17. The system of claim 14, wherein a base material of the first target is different from a base material of the second target.

18. The system of claim 14, further comprising a controller that controls properties of the thin film by controlling arrival rates at the exposed surface of the at least one substrate of the atoms sputtered from the surfaces of the first and second targets and the neutral chemically reactive molecular fragments, atoms or radicals scattered from the first and second targets.

19. The system of claim 18, wherein the at least one ion source includes a first ion source that generates a first divergent ion current directed predominately at the first target and a second ion source that generates a second divergent ion current directed predominately at the second target.

20. The system of claim 19, wherein a base material of the first target is the same as a base material of the second target.

21. The system of claim 19, wherein a base material of the first target is different from a base material of the second target.

22. The system of claim 19, wherein an amount of material sputtered from the first target is different from an amount of material sputtered from the second target.

23. The system of claim 19, wherein the first divergent ion current includes a first species of ions that is different from a second species of ions in the second divergent ion current.

24. The system of claim 23, wherein the first species comprises inert gas ions and the second species comprises reactive molecular gas ions.

25. The system of claim 23, wherein the first and second species respectively comprise first and second species of reactive molecular gas ions.

26. The system of claim 23, further comprising a controller that independently controls a quantity of the first species of ions directed at the first target and a quantity of the second species of ions directed at the second target.

27. The system of claim 26, wherein the controller independently controls a first magnitude of flux of neutral chemically reactive molecular fragments, atoms or radicals scattered from the first target and a second magnitude of flux of neutral chemically reactive molecular fragments, atoms or radicals scattered from the second target.

28. The system of claim 27, wherein a chemical composition of the thin film depends at least in part on a ratio of the first magnitude to the second magnitude, and wherein the controller varies the ratio over time such that the chemical composition of the thin film formed on the exposed surface of the at least one substrate varies within a thickness of the thin film.

29. The system of claim 28, wherein the chemical composition of the thin film formed on the exposed surface of the at least one substrate varies in a sinusoidal fashion within the thickness of the thin film.

30. The system of claim 28, wherein the chemical composition of the thin film formed on the exposed surface of the at least one substrate varies in a parabolic fashion within the thickness of the thin film.

31. The system of claim 28, wherein the chemical composition of the thin film formed on the exposed surface of the at least one substrate varies in as a step function within the thickness of the thin film.

32. A method for forming a chemically reacted layer proximate an exposed surface of at least one substrate, comprising:

(a) providing a chemically reactive molecular gas to at least one ion source;

(b) generating, with the at least one ion source, at least one divergent ion current directed at at least one target, wherein the ion current contains at least one species of chemically reactive molecular ion, and the at least one target is disposed in a chamber having a partial vacuum in the range of $10^{-2}$ to $10^{-5}$ Torr;

(c) applying a bias to the at least one target with respect to ground such that chemically reactive molecular ions from the at least one ion source are accelerated toward the at least one target with sufficient kinetic energy to dissociate at least some of the chemically reactive molecular ions by collision with a surface of the at least one target to form a population of neutral chemically reactive molecular fragments, atoms or radicals at least some of which scatter away from the surface of the at least one target and into the chamber; and (d) intercepting, with at least one substrate in the chamber, at least a portion of said population of neutral chemically reactive molecular fragments, atoms or radicals at an exposed surface of the at least one substrate, wherein the neutral chemically reactive molecular fragments, atoms or radicals intercepted at the exposed surface of the at least one substrate have a kinetic energy that is a function of a value of the bias;

wherein the chemically reacted layer corresponds to a product of at least one chemical reaction of the neutral chemically reactive molecular fragments, atoms or radicals intercepted at the exposed surface of the at least one substrate with other atoms proximate the exposed surface of the at least one substrate;

wherein the chemically reacted layer is formed without bombarding the exposed surface of the at least one substrate with ions;

further comprising varying the value of the bias applied to the at least one target, and thereby varying the kinetic energy of the neutral chemically reactive molecular fragments, atoms or radicals intercepted at the exposed surface of the at least one substrate.

* * * * *